US009348453B2

(12) United States Patent
Haapakoski et al.

(10) Patent No.: US 9,348,453 B2
(45) Date of Patent: May 24, 2016

(54) TOUCH SENSING ARRANGEMENT WITH FIRST AND SECOND SHIELD ELECTRODES

(71) Applicant: Nokio Corporation, Espoo (FI)

(72) Inventors: Hannu A. Haapakoski, Salo (FI); Marko K. Heikkinen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 97 days.

(21) Appl. No.: 13/758,039

(22) Filed: Feb. 4, 2013

(65) Prior Publication Data

US 2014/0218328 A1 Aug. 7, 2014

(51) Int. Cl.
G06F 3/041 (2006.01)
G02F 1/1333 (2006.01)
H03K 17/96 (2006.01)
G06F 3/044 (2006.01)

(52) U.S. Cl.
CPC .......... *G06F 3/0416* (2013.01); *G02F 1/13338* (2013.01); *H03K 17/9622* (2013.01); *G02F 2001/133334* (2013.01); *G06F 3/044* (2013.01); *G06F 2203/04107* (2013.01); *H03K 2217/960765* (2013.01); *H03K 2217/960795* (2013.01)

(58) Field of Classification Search
USPC ................................................. 345/156–178
See application file for complete search history.

(56) References Cited

U.S. PATENT DOCUMENTS

| 6,501,529 B1 | 12/2002 | Kurihara et al. | 349/160 |
| 2007/0139391 A1 | 6/2007 | Bischoff | 345/173 |
| 2010/0214247 A1* | 8/2010 | Tang et al. | 345/173 |
| 2010/0220071 A1 | 9/2010 | Nishihara et al. | 345/173 |

(Continued)

FOREIGN PATENT DOCUMENTS

| EP | 2330491 A1 | 6/2011 |
| EP | 2339433 A1 | 6/2011 |
| WO | WO 2010/088670 A1 | 8/2010 |

OTHER PUBLICATIONS

Mackey, Bob; "Innovations in Touch Sensing"; Synaptics SID 2012—Session M-3; pp. 1-85; Boston; http://blog.synaptics.com/wp-content/uploads/2012/06/SID_2012_SeminarM-3_CapacitiveTouch_Mackey_Present.pdf.

(Continued)

*Primary Examiner* — Kent Chang
*Assistant Examiner* — Nathan Brittingham
(74) *Attorney, Agent, or Firm* — Harrington & Smith

(57) ABSTRACT

An apparatus including a sensing arrangement including a plurality of distinct capacitive sensor electrodes distributed over a sensing area; conductive traces connected to the plurality of distinct capacitive sensor electrodes; a first shield electrode overlying at least the conductive traces; a second shield electrode underlying the conductive traces and the capacitive sensor electrodes; a display arrangement including a transparent cover; a polarizer, underlying the transparent cover; an intermediary layer, underlying the polarizer; an optical control layer, underlying the intermediary layer; wherein the sensing arrangement and the display arrangement are integrated, the first shield electrode being positioned beneath the transparent cover and above the polarizer; the capacitive sensor electrodes being positioned beneath the transparent cover and beneath the first shield electrode and above the optical control layer; and the second shield electrode being positioned beneath the transparent cover and beneath the capacitive sensor electrodes and above the optical control layer.

19 Claims, 5 Drawing Sheets

(56) References Cited

U.S. PATENT DOCUMENTS

Figure 1:
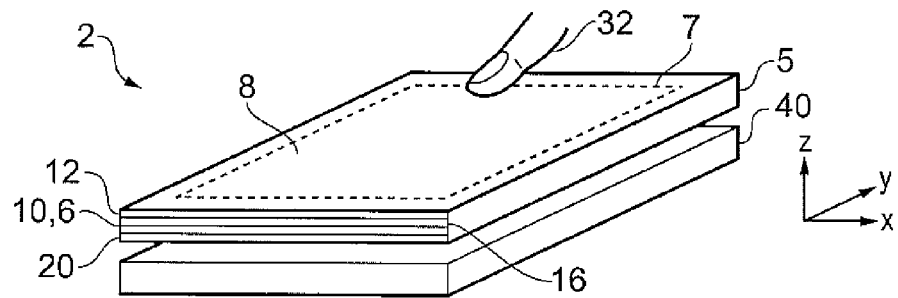

| | | | |
|---|---|---|---|
| 2010/0265188 A1 | 10/2010 | Chang | 345/173 |
| 2010/0328266 A1* | 12/2010 | Yamauchi et al. | 345/174 |
| 2011/0007021 A1* | 1/2011 | Bernstein et al. | 345/174 |
| 2011/0148812 A1 | 6/2011 | Hente | 345/174 |
| 2011/0285640 A1* | 11/2011 | Park et al. | 345/173 |
| 2011/0310459 A1 | 12/2011 | Gates | 359/296 |
| 2012/0026132 A1 | 2/2012 | Hotelling | 345/174 |
| 2012/0081328 A1 | 4/2012 | Kandziora et al. | 345/174 |
| 2013/0044074 A1* | 2/2013 | Park et al. | 345/174 |
| 2013/0127776 A1* | 5/2013 | Guard et al. | 345/174 |
| 2013/0181949 A1* | 7/2013 | Setlak | 345/175 |
| 2013/0229364 A1* | 9/2013 | Yu et al. | 345/173 |
| 2014/0232691 A1* | 8/2014 | Lee | 345/174 |

OTHER PUBLICATIONS

"Multek Display Solutions"; http://www.globalspec.com/supplier/about; as early as Oct. 22, 2012; pp. 1-2; http://www.globalspec.com/supplier/about/MultekDisplayandTouchSolutions.

* cited by examiner

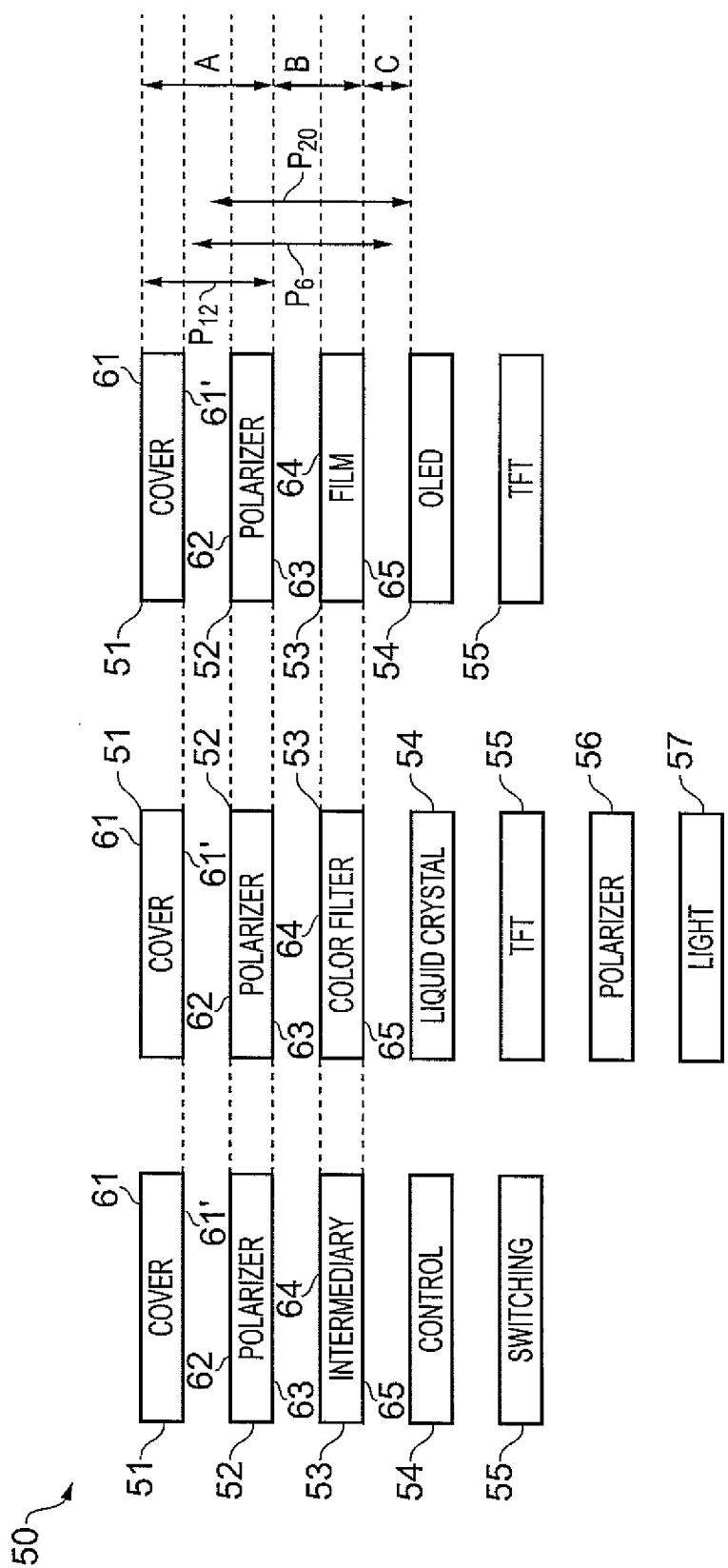

TOUCH SENSING ARRANGEMENT WITH FIRST AND SECOND SHIELD ELECTRODES

TECHNOLOGICAL FIELD

Embodiments of the present invention relate to an apparatus. In particular, they relate to an apparatus comprising a plurality of capacitive sensor electrodes distributed over a sensing area.

BACKGROUND

Current touch sensitive displays may use a plurality of capacitive sensor electrodes distributed over a sensing area. The capacitive sensor electrodes sense a proximal grounded object such as a user's finger touching the sensing area.

BRIEF SUMMARY

According to various, but not necessarily all, embodiments of the invention there is provided an apparatus comprising: a sensing arrangement comprising: an array of capacitive sensor electrodes comprising a plurality of distinct capacitive sensor electrodes distributed over a sensing area; conductive traces operatively connected to the plurality of distinct capacitive sensor electrodes; a first shield electrode overlying, in the sensing area, at least the conductive traces; a second shield electrode underlying, in the sensing area, the conductive traces and the capacitive sensor electrodes; a display arrangement comprising:
 a transparent cover
 a polarizer, underlying the transparent cover;
 an intermediary layer, underlying the polarizer;
 an optical control layer, underlying the intermediary layer;
wherein the sensing arrangement and the display arrangement are integrated, the first shield electrode being positioned beneath the transparent cover and above the polarizer;
the capacitive sensor electrodes being positioned beneath the transparent cover and beneath the first shield electrode and above the optical control layer; and
the second shield electrode being positioned beneath the transparent cover and beneath the capacitive sensor electrodes and above the optical control layer.

According to various, but not necessarily all, embodiments of the invention there is provided an apparatus comprising:
a sensing arrangement comprising:
 an array of capacitive sensor electrodes comprising a plurality of distinct capacitive sensor electrodes distributed over a sensing area;
 conductive traces operatively connected to the plurality of distinct capacitive sensor electrodes;
 a first shield electrode overlying, in the sensing area, at least the conductive traces;
 a second shield electrode underlying, in the sensing area, the conductive traces and the capacitive sensor electrodes.
a display arrangement comprising:
 a transparent cover
 a polarizer, underlying the transparent cover;
 an intermediary layer, underlying the polarizer;
 an optical control layer, underlying the intermediary layer;
wherein the sensing arrangement and the display arrangement are integrated, the first shield electrode being positioned beneath the transparent cover and above the polarizer;
the capacitive sensor electrodes being positioned beneath the transparent cover and beneath the first shield electrode and above the optical control layer; and
the second shield electrode being positioned beneath the transparent cover and beneath the capacitive sensor electrodes and above the optical control layer, wherein the second shield electrode is an integral part of the polarizer.

BRIEF DESCRIPTION

Figure 2:
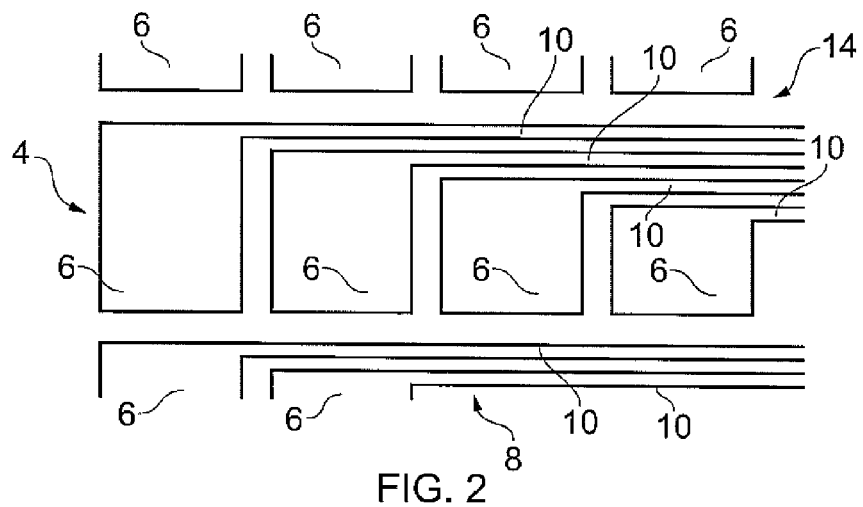
Figure 3:
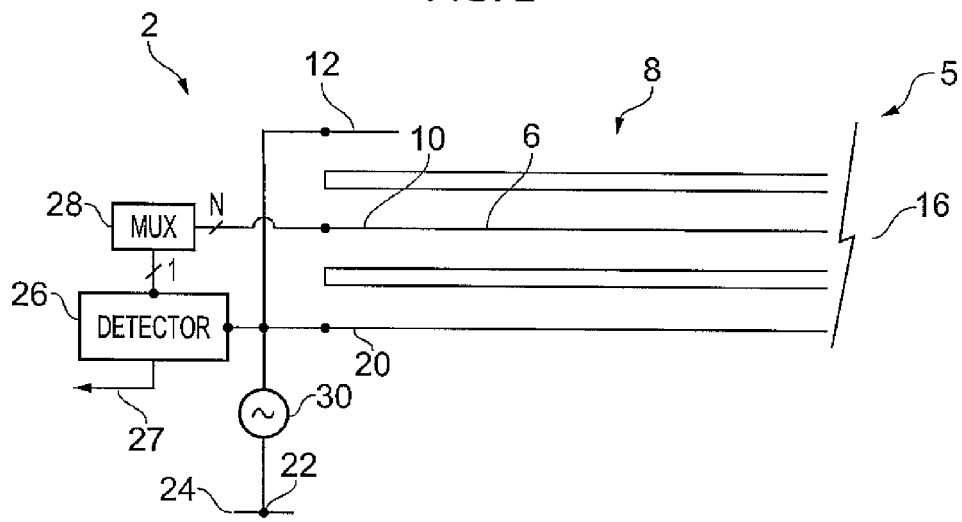

For a better understanding of various examples of embodiments of the present invention reference will now be made by way of example only to the accompanying drawings in which:
 FIG. 1 illustrates an apparatus comprising a sensing arrangement comprising a plurality of capacitive sensor electrodes distributed over a sensing area;
 FIG. 2 illustrates one example of a sensing arrangement comprising a plurality of capacitive sensor electrodes distributed over a sensing area;
 FIG. 3 schematically illustrates a cross-section through a sensing arrangement;
 FIGS. 4A to 4C illustrate examples of display arrangements;
 FIG. 4D illustrates how the display arrangements of FIGS. 4A to 4C may be integrated with a sensing arrangement;
 FIGS. 5A, 5B, 5C and 5D illustrate examples of an apparatus comprising an integrated display and sensing arrangement.
 FIG. 6A illustrates a touch panel module;
 FIG. 6B illustrates a touch sensitive display module; and
 FIG. 6C illustrates an electronic device.

DETAILED DESCRIPTION

The Figures illustrate an apparatus 2 comprising:
a sensing arrangement 5 comprising:
 an array 4 of capacitive sensor electrodes 6 comprising a plurality of distinct capacitive sensor electrodes 6 distributed over a sensing area 8;
 conductive traces 10 operatively connected to the plurality of distinct capacitive sensor electrodes 6;
 a first shield electrode 12 overlying, in the sensing area 8, conductive traces 10; and
 a second shield electrode 20 underlying, in the sensing area 8, the conductive traces 10 and the capacitive sensor electrodes 6, and
a display arrangement 50 comprising:
 a transparent cover 51;
 a polarizer 52, underlying the transparent cover 51;
 an intermediary layer 53, underlying the polarizer 52;
 an optical control layer 54, underlying the intermediary layer 53;
wherein the sensing arrangement 5 and the display arrangement 50 are integrated,
the first shield electrode 12 being positioned beneath the transparent cover 51 and above the polarizer 52;
the capacitive sensor electrodes 6 being positioned beneath the transparent cover 51 and beneath the first shield electrode 12 and above the optical control layer 54; and
the second shield electrode 20 being positioned beneath the transparent cover 51 and beneath the capacitive sensor electrodes 6 and above the optical control layer 54.

FIG. 1 illustrates an apparatus 2 comprising: a sensing arrangement 5 comprising a plurality of capacitive sensor electrodes 6 distributed over a sensing area 8 and conductive traces 10 at least partially distributed over the sensing area 8; and a shield electrode 12 partially overlying, in the sensing area 8, the sensing arrangement 5.

In this example, the apparatus 2 overlies a display 40 and operates as a capacitive touch panel for the display 40. The display 40 and the apparatus 2 in combination form a touch sensitive display configured to detect a variation in capacitance arising from proximity of a user input device 32 to one or more of the plurality of sensor electrodes 6.

The sensing arrangement 5 is configured to sense a variation in capacitance arising from proximity of a user input device 32 at or over the sensing area 8 of a touch surface 7. In this example the user input device 32 is a user's finger.

The apparatus 2 is configured to sense not only the (x, y) position of the user's finger within the sensing area 8 when it touches the sensing area 8 of the touch surface 7 but may also, in this example, additionally provide a (z) position of the user's finger when it is close to but not touching the sensing area 8 of the touch surface 7 and/or provide an (x, y) position of the user's finger when it is close to but not yet touching the sensing area of the touch surface 7. The apparatus 2 therefore provides for not only two-dimensional sensing but also three-dimensional sensing.

The apparatus 2 also comprises a second shield electrode 20 underlying, in the sensing area 8, the conductive traces 10 and the sensor electrodes 6. The second shield electrode 20 may be a continuous uninterrupted electrode.

The first shield electrode 12, the conductive traces 10, the capacitive sensor electrodes 6 and the second shield electrode 20 are all positioned at least within the sensing area 8 and overlie, in this example, a display 40. As they overlie a display 40 they are preferably transparent.

The first shield electrode 12, the conductive traces 10, the capacitive sensor electrodes 6 and the second shield electrode 20 may therefore be formed from conductive and transparent material. They may be formed from the same or similar material or mixtures of material. Examples of suitable conductive and transparent materials include, for example, Indium-Tin-Oxide (ITO), metal mesh, silver nanowires and carbon nanotube composite.

FIG. 2 illustrates one example of a sensing arrangement 5 comprising a plurality of capacitive sensor electrodes 6 distributed over a sensing area 8 and conductive traces 10 partially distributed over the sensing area 8. The plurality of capacitive sensor electrodes 6 are arranged as a regular array in this example. The capacitive sensor electrodes are arranged as a N row by M column regular array, with common fixed spacing between columns and common fixed spacing between rows.

Each capacitive sensor electrode 6 has an associated conductive trace 10 for conveying a signal generated by that sensor electrode 6 away from the sensor area 8. In the illustrated example, each sensor electrode 6 and its associated conductive trace 10 is physically connected. The sensor electrodes 6 and the conductive traces 10 may be arranged within a common plane 16. They may, for example, be formed by patterning a planar layer of transparent conductive material.

The first shield electrode 12, in this example but not necessarily all examples, overlies at least portions of at least some of the sensor electrodes 6.

In the illustrated example, the first shield electrode 12 overlies, in the sensing area 8, all of the conductive traces 10. In other examples, the first shield electrode 12 does not overlie, in the sensing area 8, all of the conductive traces 10 but instead overlies more than 80% of the area 14 occupied by the conductive traces 10.

It is desirable to keep the electrical resistance of the conductive traces 10 small to reduce resistance-capacitance (RC) delays and improve measurement speed. This may be achieved by using material that has a higher conductivity and/or by making the conductive traces 10 wider. However, widening the conductive traces 10 increases the area 14 occupied by the conductive traces 10 and may create undesirable stray capacitance effects. However this effect is reduced or eliminated by the overlying shield electrode 12.

FIG. 3 schematically illustrates a cross-section through the sensing arrangement 5 along a line corresponding to an 'operational' capacitive sensor electrode. That is the first shield electrode 12 along this cross-section does not cover the capacitive sensor electrodes 6.

The first shield electrode 12 is operatively connected to a node 22. Operatively connected means that there is a signal path but they may or may not be directly physically connected. When the apparatus 2 is operational the node 22 is held at a constant potential such as, for example, ground potential. Circuitry 24 is configured to provide a reference voltage signal to the first shield electrode 12. The circuitry 24 could be a simple galvanic connection to ground provided by, for example, a housing, a ground plane or a chassis.

In this example, a second shield electrode 20 is present. It is also operatively connected to the node 22.

Detection circuitry 26 is operatively connected between the first shield electrode 12 and the array 4 of capacitive sensor electrodes 6.

A multiplexer 28 is operatively connected between the detection circuitry 26 and the array 4 of capacitive sensor electrodes 6. The multiplexer 28 is configured to isolate, for detection, each of the plurality of capacitive sensor electrodes 6 of the array 4.

Drive circuitry 30 is configured to provide an alternating voltage to the first shield electrode 12 and, if present, the second shield electrode 20.

The drive circuitry 30 is configured to provide a time varying electric field at each of the sensor electrodes 6.

The detection circuitry 26 is configured to detect a variation in capacitance arising from proximity of a user input device 32 to one or more of the plurality of sensor electrodes 6. The detection circuitry 26 may comprise a low-impedance charge amplifier.

When the user's hand, or some other grounded user input device 32, is brought to the vicinity of the sensing area 8 of the apparatus 2, a capacitive current flows from the first shield electrode 12 through the detection circuitry 26 to one or more capacitive sensor electrodes 6. The charge amplifier in the detection circuitry 26 registers a charge displacement due to the current. The output of the charge amplifier is synchronously rectified and integrated, after which it is passed to an analog-to-digital converter and then provided as digital output 27 for processing in the digital domain.

The drive voltage and the drive frequency typically range from 1 V to 10 V and from 10 to 200 kHz, respectively.

Due to reasons of cost and size, a single charge amplifier and a single analog-to-digital converter may be used in the detection circuitry 26 for multiple capacitive sensor electrodes 6 and a multiplexer 28 may be used to isolate for sensing each capacitive sensor electrode 6 separately.

FIGS. 4A to 4C illustrate examples of display arrangements 50 and FIG. 4D illustrates how the display arrangement and the previously described sensing arrangement 5 can be integrated in an apparatus 2.

FIG. 4A illustrates a generic display arrangement 50. This display arrangement 50 comprises: a transparent cover 51; a polarizer 52, underlying the transparent cover 51; an intermediary layer 53, underlying the polarizer 52; and an optical control layer 54, underlying the intermediary layer 53.

The transparent cover 51 is a protective cover 51. It may be formed from glass, plastic or other transparent material. Transparent means optically clear, that is not obscured, it does not prevent the material being colored or uncoloured.

The optical control layer 54 is used to control the display output.

The optical control layer 54 may, for example, be a material that modulates a property of light that is transmitted through it. For example, a liquid crystal can be used to change a polarisation state of light.

The optical control layer 54 may, for example, be a material that is controlled to emit light in a variable manner. For example, organic light emitting diodes can be used to emit different colors or light with different intensities.

If the display arrangement is an active matrix display, then a switching layer 55 will be present, underlying the optical control layer 54.

FIG. 4B illustrates a specific example of the generic display arrangement illustrated in FIG. 4A. This specific example is a liquid crystal display arrangement 50.

In this example, the optical control layer 54 is a layer of liquid crystal. The intermediary layer 53 may be used to seal and protect the nematic liquid crystal layer 54. In this example, the intermediary layer 53 is a color filter 53.

The switching layer 55 may comprise an array of transistors used to actively switch the local state of the nematic liquid crystal in the optical control layer 54. The transistors may, for example, be thin film transistors.

The light crystal display arrangement 50 illustrated is a transmissive arrangement. It comprises an underlying light emitter 57, which transmits light through a polarizer layer 56, the switching layer 55 and then through the overlying layers 54, 53, 52, 51.

FIG. 4C illustrates a specific example of the generic display arrangement illustrated in FIG. 4A. This specific example is an organic light emitting diode (OLED) display arrangement 50.

In this example, the optical control layer 54 is a layer of organic light emitting material. The intermediary layer 53 may be used to seal and protect the organic light emissive material. In this example, the intermediary layer 53 is an encapsulating layer.

The switching layer 55 may comprise an array of transistors used to actively switch the local state of the organic light emissive material. The transistors may, for example, be thin film transistors.

The OLED display arrangement 50 illustrated is an emissive arrangement. The organic light emissive material in the optical control layer 54 selectively emits light under the control of the switching layer 55.

As will be appreciated from the description of FIGS. 1 to 3, a sensing arrangement 5 comprises: an array 4 of capacitive sensor electrodes 6 comprising a plurality of distinct capacitive sensor electrodes 6 distributed over a sensing area 8; conductive traces 10 operatively connected to the plurality of distinct capacitive sensor electrodes 6; a first shield electrode 12 overlying, in the sensing area 8, conductive traces 10; and a second shield electrode 20 underlying, in the sensing area 8, the conductive traces 10 and the capacitive sensor electrodes 6.

There is a common connection between first and second shield electrode which is configured to be connected to drive circuitry 30 and detector 26 (see FIG. 3).

FIG. 4D illustrates how such a sensing arrangement 5 may be integrated with the display arrangement 50 during manufacture.

FIG. 4D illustrates positions where the components of the sensing arrangement 5 may placed among the components of the display arrangement 50, while respecting the above described ordering of the components of the sensing arrangement 5.

The order is that the first shield electrode 12 is uppermost. It is above the plane 16 occupied by the conductive traces 10 and the capacitive sensor electrodes 6. The second shield electrode 20 is lowermost. It is below the plane 16 occupied by the conductive traces 10 and the capacitive sensor electrodes 6.

The possible positions of the components of the sensing arrangement 5 may be divided into three distinct bands.

Band A is the space from a bottom surface 63 of the polarizer 52 to an upper surface 61 of the cover 51.

Band B is the space from the bottom surface 63 of the polarizer 52 to a bottom surface 65 of the intermediary layer 53. Bands A and B overlap only at the bottom surface 63 of the polarizer.

Band C is the space from the bottom surface 65 of the intermediary layer 53 and above a bottom surface of the optical control layer 54. Bands B and C overlap only at the bottom surface 65 of the intermediary layer 53.

The possible positions of the first shield electrode 12 of the sensing arrangement 5 are illustrated using the label $P_{12}$. The first shield electrode is positioned within band A.

The first shield electrode 12 may be attached to the transparent cover 51 either directly or indirectly, for example, by depositing conductive material on an upper side 61 (or under side 61') of the transparent cover 51 or for example by adhering the first shield electrode 12 to the upper side 61 (or under side 61') of the transparent cover 51, either directly or indirectly, using optically transparent material.

The first shield electrode 12 may be attached to the polarizer 52 either directly or indirectly, for example, by depositing conductive material on an upper side 62 (or under side 63) of the polarizer 52 or for example by adhering the first shield electrode 12 to the upper side 62 (or under side 63) of the polarizer 52, either directly or indirectly, using optically transparent material.

The possible positions of the capacitive sensor electrodes 6 (and conductive traces 10) of the sensing arrangement 5 are illustrated using the label $P_6$. The capacitive sensor electrodes 6 (and conductive traces 10) are positioned within band A or band B or band C.

When positioned within band A, the capacitive sensor electrodes 6 (and conductive traces 10) may be attached to the polarizer 52 either directly or indirectly, for example, by depositing conductive material on an upper side 62 (or under side 63) of the polarizer 52 or for example by adhering the capacitive sensor electrodes 6 (and conductive traces 10) to the upper side 62 (or under side 62) of the polarizer 52, either directly or indirectly, using optically transparent material.

When positioned within band B, the capacitive sensor electrodes 6 (and conductive traces 10) may be attached to the polarizer layer 52 either directly or indirectly, for example, by depositing conductive material on an under side 63 of the polarizer layer 52 or for example by adhering the capacitive sensor electrodes 6 (and conductive traces 10) to the under side 63 of the polarizer layer 52, either directly or indirectly, using optically transparent material.

When positioned within band B, the capacitive sensor electrodes 6 (and conductive traces 10) may be attached to the intermediary layer 53 either directly or indirectly, for example, by depositing conductive material on an upper side 64 (or under side 65) of the intermediary layer 53 or for example by adhering the capacitive sensor electrodes 6 (and conductive traces 10) to the upper side 64 (or under side 65) of the intermediary layer 53, either directly or indirectly, using optically transparent material.

When positioned within band C, the capacitive sensor electrodes 6 (and conductive traces 10) may be attached to the intermediary layer 53 either directly or indirectly, for example, by depositing conductive material on an under side 65 of the intermediary layer 53 or for example by adhering the capacitive sensor electrodes 6 (and conductive traces 10) to the under side 65 of the intermediary layer 53, either directly or indirectly, using optically transparent material.

The possible positions of the second shield electrode 20 of the sensing arrangement 5 are illustrated using the label $P_{20}$. The second shield electrode 20 is positioned within band A or band B or band C. In some embodiments, the second shield electrode 20 is positioned only within band B or band C.

When positioned within band A, the second shield electrode 20 may be attached to the polarizer 52 either directly or indirectly, for example, by depositing conductive material on an upper side 62 of the polarizer 52 or for example by adhering the second shield electrode 20 to the upper side 62 of the polarizer 52, either directly or indirectly, using optically transparent material.

When positioned within band B, the second shield electrode 20 may be attached to the polarizer layer 52 either directly or indirectly, for example, by depositing conductive material on an under side 63 of the polarizer layer 52 or for example by adhering the second shield electrode 20 to the under side 63 of the polarizer layer 52, either directly or indirectly, using optically transparent material.

When positioned within band B, the second shield electrode 20 may be attached to intermediary layer 53 either directly or indirectly, for example, by depositing conductive material on an upper side 64 (or lower side 65) of the intermediary layer 53 or for example by adhering the second shield electrode 20 to the upper side 64 (or lower side 65) of the intermediary layer 53, either directly or indirectly, using optically transparent material.

When positioned within band C, the second shield electrode 20 may be attached to the intermediary layer 53 either directly or indirectly, for example, by depositing conductive material on an under side 65 of the intermediary layer 53 or for example by adhering the second shield electrode 20 to the under side 65 of the intermediary layer 53, either directly or indirectly, using optically transparent material.

It will therefore be appreciated from the foregoing that the first shield electrode 12 may be positioned above the intermediary layer 53; the capacitive sensor electrodes 6 may be positioned beneath the transparent cover 51 and beneath the first shield electrode 12 and above the optical control layer 54; and the second shield electrode 20 may be positioned beneath the transparent cover 51 (e.g. beneath the polarizer layer 52) and beneath the capacitive sensor electrodes 6 and above the optical control layer 54/switching layer 55.

FIGS. 5A, 5B, 5C and 5D illustrate some but not all of the implementations of the apparatus 2 comprising integrated display arrangement 50 and sensing arrangement 5.

In each of FIGS. 5A, 5B, 5C and 5D, the conductive traces 10 are overlapped by the overlying first shield electrode 12.

Figure 5A:
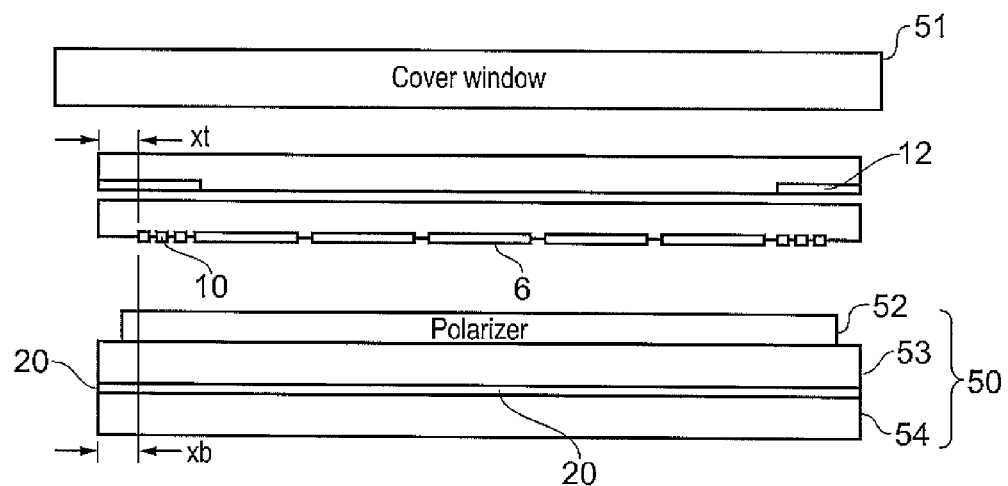
Figure 6A:
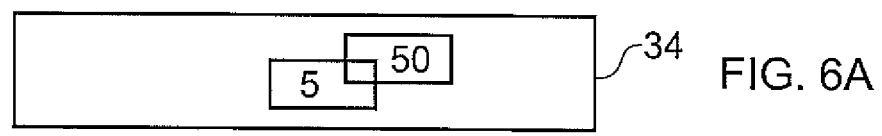
Figure 6B:
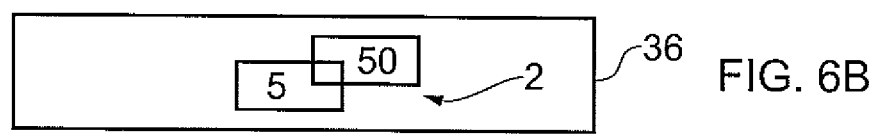
Figure 6C:
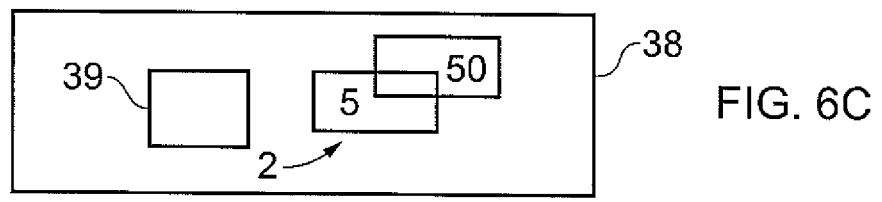

In FIG. 5A, the second shield electrode 20 is implemented between the intermediary layer 53 and a bottom off the optical control layer 54. The optical control layer 54 may be on top of a substrate. The second shield electrode 20 is a dedicated electrically uniform conductive layer which is normally optically transparent or the electrode 20 is part of any suitable layers existing between the layers 53, 54. In FIG. 5A, the first shield electrode 12 and the capacitive sensor electrodes 6 (and conductive traces 10) are in band A and the second shield electrode 20 is beneath the polarizer layer 52 in band C.

Figure 5B:
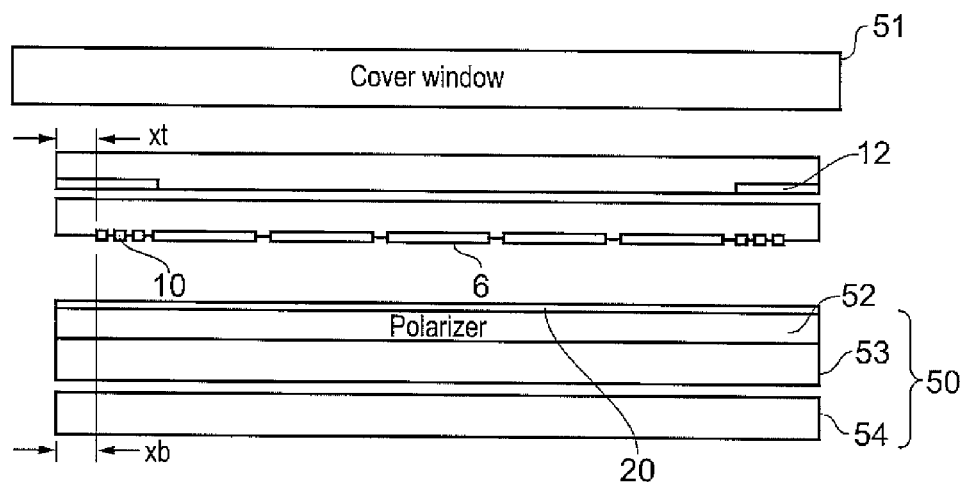

In FIG. 5B, the second shield electrode 20 is implemented on top of the polarizer layer 52, for example, as an integral part of the polarizer layer 52. The second shield electrode 20 is a dedicated electrically uniform conductive layer which is normally optically transparent or the electrode 20 is part of any suitable layers existing on the polarizer layer 52. In FIG. 5B, the first shield electrode 12, the capacitive sensor electrodes 6 (and conductive traces 10) and the second shield electrode 20 are in band A.

Figure 5C:
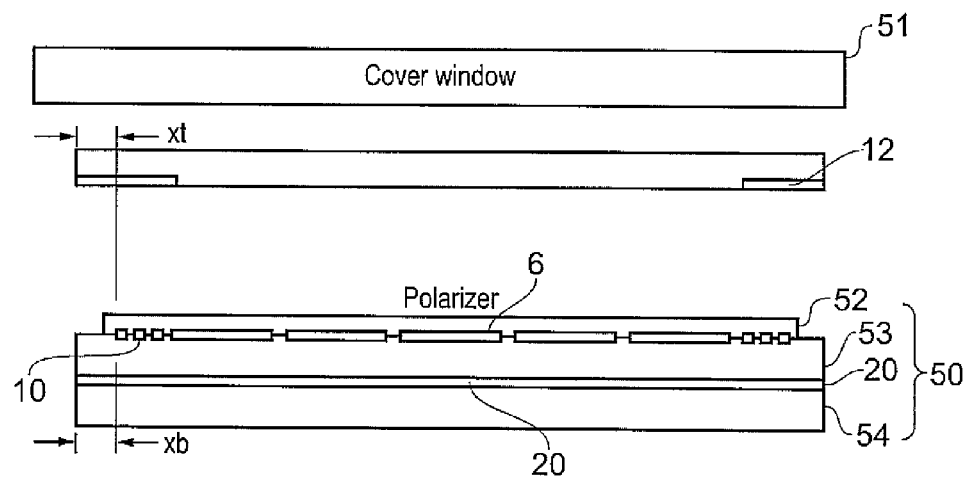

In FIG. 5C, the first shield electrode 10 is implemented under the window 51 and above the polarizer 52. The capacitive sensor electrodes 6 (and conductive traces 10) are implemented between the polarizer layer 52 and the intermediary layer 53. The second shield electrode 20 is implemented between the intermediary layer 53 and a bottom of the optical control layer 54. The optical control layer 54 may be on top of a substrate. The second shield electrode 20 is a dedicated electrically uniform conductive layer which is normally optically transparent or the electrode 20 is part of any suitable layers existing between and/or including the layers 53, 54.

In FIG. 5C, the first shield electrode 12 is in band A, the capacitive sensor electrodes 6 (and conductive traces 10) are in band B and the second shield electrode 20 is beneath the polarizer layer 52, in band C. The separation of components into separate bands separates the components. If separation of the components is a design requirement, then this design requirement may be fulfilled without using additional separating layers.

Figure 5D:
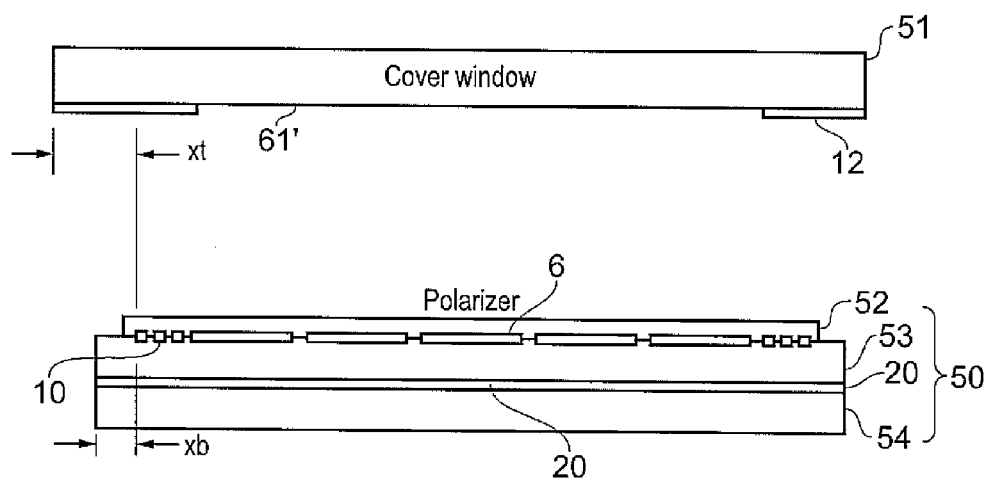

In FIG. 5D, the first shield electrode 10 is implemented on a bottom surface 61' of a cover window 51. The second shield electrode 20 is implemented between the intermediary layer 53 and optical control layer 54. The optical control layer 54 may be on top of a substrate. The second shield electrode 20 is a dedicated electrically uniform conductive layer which is normally optically transparent or the electrode 20 is part of any suitable layers existing between and/or including the layers 53, 54. The capacitive sensor electrodes 6 (and conductive traces 10) are implemented between the polarizer layer 52 and the intermediary layer 53. In FIG. 5D, the first shield electrode 12 is in band A, the capacitive sensor electrodes 6 (and conductive traces 10) are in band B and the second shield electrode 20 is beneath the polarizer layer 52, in band C.

In FIGS. 5A, 5C and 5D, where the second shield electrode 20 is positioned under the intermediate layer 53 and the capacitive sensor electrodes 6 (and conductive traces 10) are positioned above the intermediate layer 53, the capacitive sensor electrodes 6 (and conductive traces 10) and the second shield electrode 20 are physically separated by at least the thickness of the intermediary layer 53. This electrically separates the capacitive sensor electrodes 6 (and conductive traces 10) and the second shield electrode 20. The capacitive sensor electrodes 6 (and conductive traces 10) can therefore be formed directly on the top substrate of the display (intermediary layer 53) while retaining a required electrical separation.

FIG. 6A illustrates a touch panel module 34 that comprise the apparatus 2 an integrated display and sensing arrangement. The apparatus 2 is operable as a functional sensing arrangement and, with additional components, as a functional display. The touch panel module 34 may be used in combination with a light source 57 and a polarizer 56 to form a touch screen display.

FIG. 6B illustrates a touch sensitive display module 36 that comprises in an apparatus 2 an integrated display and sensing arrangement. The apparatus 2 is operable as a functional display arrangement 50 and a functional sensing arrangement 5.

FIG. 6C illustrates an electronic device 38 that at least comprises in an apparatus 2 an integrated display and sensing arrangement. The apparatus 2 is operable as a functional display arrangement 50 and a functional sensing arrangement 5. The electronic device 38 may, for example, additionally comprise a processor 39 that processes the output 27 of the detection circuitry 26.

As used here 'module' refers to a unit or apparatus that excludes certain parts/components that would be added by an end manufacturer or a user.

Operatively connected means connected in a manner that enables the required functionality (operation). Any number or combination of intervening elements can exist (including no intervening elements) between two items that are operatively connected.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a sensing arrangement comprising:
      an array of capacitive sensor electrodes comprising a plurality of distinct capacitive sensor electrodes distributed over a sensing area;
      conductive traces operatively connected to the plurality of distinct capacitive sensor electrodes;
      a first shield electrode overlying, at least the conductive traces;
      a second shield electrode underlying, in the sensing area, the conductive traces and the capacitive sensor electrodes;
   a display arrangement comprising:
      a transparent cover;
      a polarizer, underlying the transparent cover;
      an intermediary layer, underlying the polarizer;
      an optical control layer, underlying the intermediary layer;
   wherein the sensing arrangement and the display arrangement are integrated,
   the first shield electrode being positioned beneath the transparent cover and above the polarizer;
   the capacitive sensor electrodes being positioned beneath the first shield electrode and above the optical control layer;
   the second shield electrode being positioned beneath the capacitive sensor electrodes and above the optical control layer;
   wherein the capacitive sensor electrodes are positioned beneath the polarizer and the second shield electrode is positioned beneath the intermediary layer; and
   wherein the apparatus is configured to provide an alternating voltage to the first shield electrode and the second shield electrode.

2. An apparatus as claimed in claim 1, wherein the second shield electrode is positioned beneath the polarizer and beneath the capacitive sensor electrodes.

3. An apparatus as claimed in claim 2, wherein the second shield electrode is positioned beneath the intermediary layer.

4. An apparatus as claimed in claim 3, wherein the capacitive sensor electrodes are positioned above the intermediate layer.

5. An apparatus as claimed in claim 1, wherein the second shield electrode is attached to the intermediary layer.

6. An apparatus as claimed in claim 1, wherein the capacitive sensor electrodes are positioned beneath the transparent cover and beneath the first shield electrode and above the intermediary layer.

7. An apparatus as claimed in claim 1, wherein the capacitive sensor electrodes are positioned beneath the polarizer and beneath the first shield electrode and above the intermediary layer.

8. An apparatus as claimed in claim 1, wherein the capacitive sensor electrodes are attached to the polarizer or attached to the intermediary layer.

9. An apparatus as claimed in claim 1, wherein the first shielding electrode is attached to the transparent cover or attached to the polarizer.

10. An apparatus as claimed in claim 1, wherein the display arrangement further comprises an electrically controlled switching layer, underlying the optical control layer.

11. An apparatus as claimed in claim 1, comprising a common connection between first and second shield electrode.

12. An apparatus as claimed in claim 1, wherein the second shield electrode is a continuous uninterrupted electrode.

13. An apparatus as claimed in claim 1, wherein the sensor electrodes, the conductive traces and the second shield electrode are transparent.

14. An apparatus as claimed in claim 1, comprising detection circuitry connected between the first shield electrode and the array of capacitive sensor electrodes.

15. An apparatus as claimed in claim 1, comprising drive circuitry configured to provide an alternating voltage to the first shield electrode.

16. An apparatus as claimed in claim 1, comprising drive circuitry configured to provide a time varying electric field at each of the sensor electrodes and detection circuitry configured to detect a variation in capacitance arising from proximity of a user input device to one or more of the plurality of sensor electrodes.

17. An apparatus as claimed in claim 1 embodied as a touch panel module.

18. An apparatus comprising:
   a sensing arrangement comprising:
      an array of capacitive sensor electrodes comprising a plurality of distinct capacitive sensor electrodes distributed over a sensing area;
      conductive traces operatively connected to the plurality of distinct capacitive sensor electrodes;
      a first shield electrode overlying, at least the conductive traces;
      a second shield electrode underlying, in the sensing area, the conductive traces and the capacitive sensor electrodes;
   a display arrangement comprising:
      a transparent cover;
      a polarizer, underlying the transparent cover;
      an intermediary layer, underlying the polarizer;

an optical control layer, underlying the intermediary layer;
wherein the sensing arrangement and the display arrangement are integrated,
the first shield electrode being positioned beneath the transparent cover and above the polarizer;
the capacitive sensor electrodes being positioned beneath the first shield electrode and above the optical control layer;
the second shield electrode being positioned beneath the capacitive sensor electrodes and above the optical control layer, wherein the second shield electrode is an integral part of the polarizer and the capacitive sensor electrodes are positioned beneath the polarizer and the second shield electrode is positioned beneath the intermediary layer; and
wherein the apparatus is configured to provide an alternating voltage to the first shield electrode and the second shield electrode.

19. An apparatus comprising:
a sensing arrangement comprising:
    an array of capacitive sensor electrodes comprising a plurality of distinct capacitive sensor electrodes distributed over a sensing area;
    conductive traces operatively connected to the plurality of distinct capacitive sensor electrodes;
    a first shield electrode, overlying, in the sensing area, at least the conductive traces;
    a second shield electrode underlying, in the sensing area, the conductive traces and the capacitive sensor electrodes;
a display arrangement comprising:
    a transparent cover;
    a polarizer, underlying the transparent cover;
    an intermediary layer, underlying the polarizer;
    an optical control layer, underlying the intermediary layer;
wherein the sensing arrangement and the display arrangement are integrated,
the first shield electrode being positioned beneath the transparent cover and above the polarizer;
the capacitive sensor electrodes being positioned beneath the first shield electrode and above the optical control layer;
the second shield electrode being positioned beneath the capacitive sensor electrodes and above the optical control layer;
wherein the capacitive sensor electrodes are positioned beneath the polarizer and the second shield electrode is positioned beneath the intermediary layer; and
wherein the apparatus is configured to provide an alternating voltage to the first shield electrode and the second shield electrode.

* * * * *